(12) United States Patent
Jo

(10) Patent No.: US 6,707,744 B2
(45) Date of Patent: Mar. 16, 2004

(54) APPARATUS FOR CONTROLLING REFRESH OF MEMORY DEVICE WITHOUT EXTERNAL REFRESH COMMAND AND METHOD THEREOF

(75) Inventor: Seong-Kue Jo, Suwon (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 29 days.

(21) Appl. No.: 10/205,334

(22) Filed: Jul. 25, 2002

(65) Prior Publication Data

US 2003/0107938 A1 Jun. 12, 2003

(30) Foreign Application Priority Data

Dec. 7, 2001 (KR) .......................................... 2001-77456

(51) Int. Cl.[7] ................................................ G11C 7/00
(52) U.S. Cl. ........................................ 365/222; 365/195
(58) Field of Search ................................. 365/222, 195, 365/189.01, 191

(56) References Cited

U.S. PATENT DOCUMENTS 5,703,823 A * 12/1997 Douse et al. ................ 365/222

* cited by examiner

Primary Examiner—David Lam
(74) Attorney, Agent, or Firm—F. Chau & Associates, LLP

(57) ABSTRACT

An apparatus and method for controlling a refresh operation of a memory device capable of performing an internal refresh after a power-up sequence is completed. The apparatus an apparatus for controlling a refresh operation of a memory device comprising DRAM memory cells and a SRAM interface, comprises a control circuit for outputting a control signal in a second state in response to a power-up signal during a predetermined period, the second state for disabling refresh operations, and for outputting the control signal in a first state in response to a command signal, wherein the command signal is a first active command input signal after the predetermined period, and a refresh pulse generating circuit for outputting a pulse signal for refreshing the DRAM memory cells in response to the control signal in the first state.

17 Claims, 3 Drawing Sheets

APPARATUS FOR CONTROLLING REFRESH OF MEMORY DEVICE WITHOUT EXTERNAL REFRESH COMMAND AND METHOD THEREOF

CROSS-REFERENCE TO RELATED APPLICATION

This application claims priority to Korean Patent Application No. 2001-77456 filed on Dec. 7, 2001.

BACKGROUND OF THE INVENTION

1. Technical Field

The present invention relates to a semiconductor memory device, and more particularly, to an apparatus and method for controlling refresh of a semiconductor memory device comprising a Dynamic Random Memory (DRAM) memory cell and a Static Random Access Memory (SRAM) interface.

2. Description of Related Art

Generally, DRAM memory cells employ cell capacitors for storing data and cell transistors for accessing the stored data. If the cell capacitors lose their charge due to leakage current, the data is lost. Therefore, DRAM memory cells have to be periodically refreshed. Refresh is a recharging process to hold the data stored in the DRAM memory cells. The refresh operation is usually activated by an external refresh command.

SRAMs retain data bits in their memory cells as long as power is supplied. Thus, SRAMs do not need to be periodically refreshed. Memory devices having DRAM memory cells and an SRAM interface generally refresh the DRAM memory cells without responding to external refresh commands.

FIG. 1 is a timing diagram of an internal refresh operation of a conventional memory device having DRAM memory cells and an SRAM interface. A power-up sequence starts from a time when an external power voltage (EVCC) is saturated or reaches steady state, to a time when a predetermined time (for example, 200□s) elapses. The power-up sequence takes a time interval (T10). During the power-up sequence (T10), the memory device does not consume current, and voltage levels of internal power voltage generating circuits (for example, various DC generating circuits) are set to target voltage levels for normal refresh operation.

A refresh oscillator (Ref. Oscillator) (not shown) is activated at a voltage lower than the full external power voltage (EVCC) at point (A), at which a power-up signal (PVCCH) is considered to be at a logic "high" level. In response to the activation of the power-up signal (PVCCH), the refresh oscillator (Ref. Oscillator) generates a refresh pulse (REF WL) having a predetermined cycle to sequentially refresh word lines. Therefore, data stored in the DRAM memory cells are sequentially refreshed in response to the refresh pulse (REF WL).

Since the refresh oscillator (Ref. Oscillator) is activated before the external power voltage (EVCC) completes the power-up sequence (T10), some current is consumed by the conventional memory device before the external power voltage (EVCC) completes the power-up sequence (T10). This results in increased time for setting the internal power voltage generating circuit to target levels, thereby increasing the chance of unstable operation of the internal power voltage generating circuit. Further, when the power-up signal (PVCCH) reaches (A), circuits in the memory device may be triggered and enter an unspecified state.

Thus, a need exists for an apparatus which controls a semiconductor memory device to perform refresh after the power-up sequence (T10) is completed, and to perform stable refresh without false triggering.

SUMMARY OF THE INVENTION

It is an object of the present invention to provide an apparatus and method for controlling refresh of a semiconductor memory device capable of performing an internal refresh operation after a power-up sequence is completed.

It is another object of the present invention to provide an apparatus and method for controlling refresh of a semiconductor memory device to prevent current from being consumed during the power-up sequence.

It is a further object of the present invention to provide an apparatus and method for controlling refresh of a semiconductor memory device to stably operate regardless of activation level of the power-up signal (PVCCH).

According to one aspect of the present invention, an apparatus for controlling a refresh operation of a memory device comprising DRAM memory cells and a SRAM interface, comprises a control circuit for outputting a control signal in a second state in response to a power-up signal during a predetermined period, the second state for disabling refresh operations, and for outputting the control signal in a first state in response to a command signal, wherein the command signal is a first active command input signal after the predetermined period, and a refresh pulse generating circuit for outputting a pulse signal for refreshing the DRAM memory cells in response to the control signal in the first state.

In a preferred embodiment of the present invention, a control circuit comprises a node, a first element for pulling down the node to a logic low in response to the power-up signal, a second element for pulling up the node to a logic high in response to the command signal, and a third element for inverting the logic level at the node to generate the control signal.

According to another aspect of the present invention, a memory device comprising DRAM cells, comprises a control circuit for generating a control signal in response to a data write/read command, wherein the command is the first input signal after a power-up sequence is completed, and a refresh pulse generating circuit for generating a pulse signal for refreshing the DRAM cells in response to the control signal.

According to further aspect of the present invention, a method for controlling a refresh operation of a memory device comprising DRAM memory cells and an SRAM interface, comprises outputting a control signal in a second state during a predetermined period in response to a power-up signal, outputting the control signal in a first state in response to a command signal, wherein the command signal is a first active command input signal after the predetermined period, and outputting a signal pulse for refreshing the DRAM memory cells in response to the control signal in the first state.

DESCRIPTION OF PREFERRED EMBODIMENTS

Figure 1:
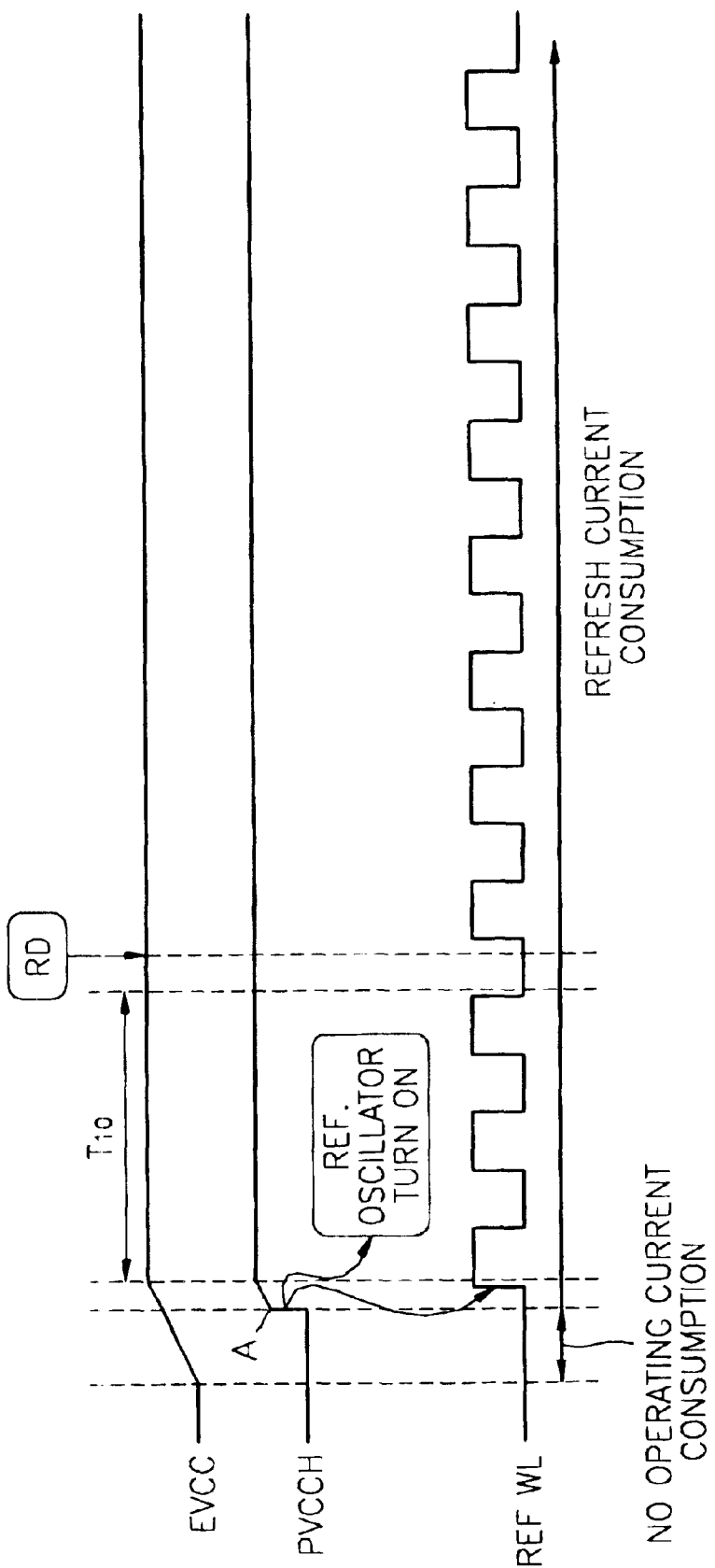
FIG. 1 is a timing diagram of a refresh operation of a conventional memory device having DRAM memory cells and a SRAM interface.
Figure 2:
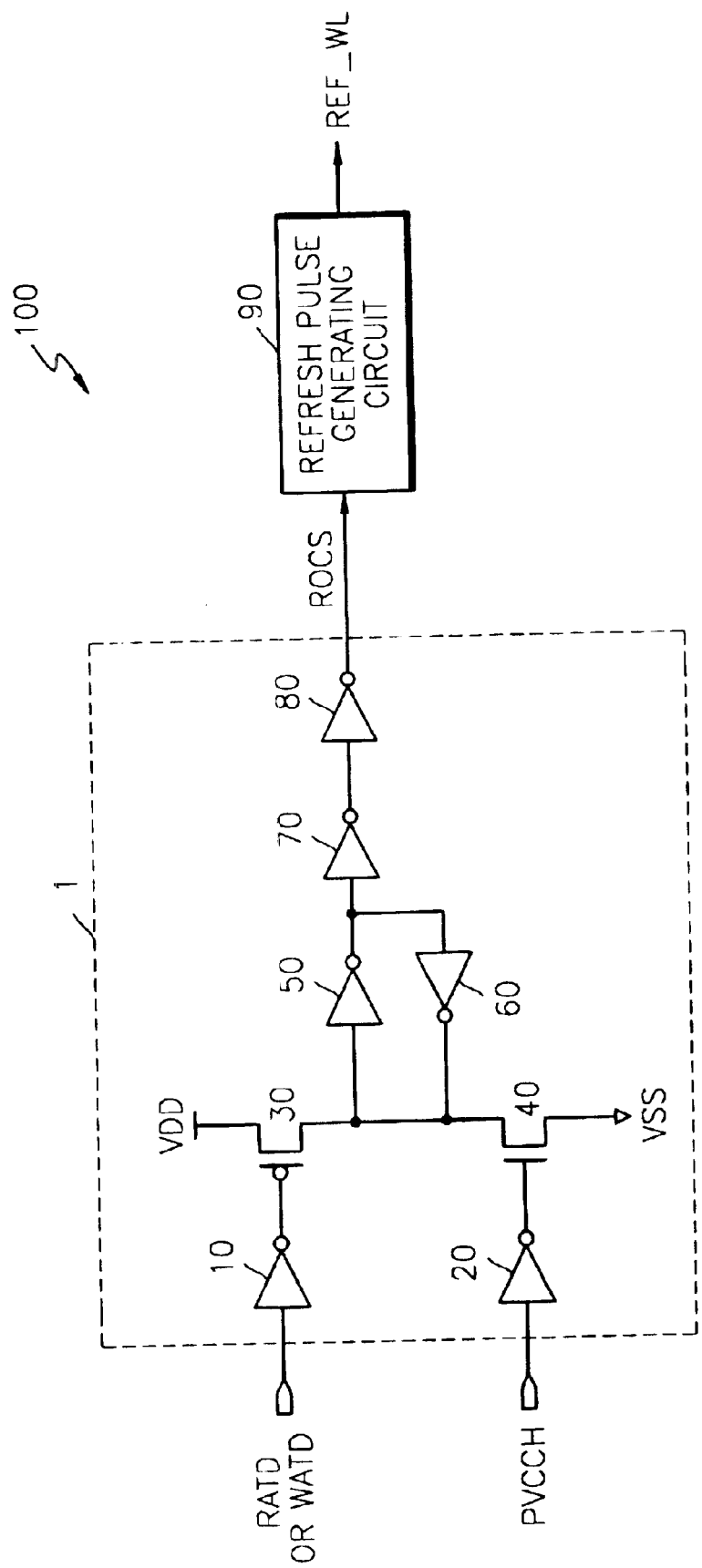
FIG. 2 is a circuit diagram of an apparatus for controlling refresh of a memory device comprising DRAM memory cells and a SRAM interface, according to a preferred embodiment of the present invention.

FIG. 2 illustrates an apparatus for controlling a refresh operation of a memory device comprising DRAM memory cells and a SRAM interface, according to a preferred embodiment of the present invention. The apparatus 100 comprises a control circuit 1 and a refresh pulse generating circuit 90. The control circuit 1 comprises a plurality of inverters 10, 20, 50, 60, 70, and 80, a PMOS transistor 30, and a NMOS transistor 40. The refresh pulse generating circuit 90 generates a refresh pulse (REF_WL) for refreshing the DRAM memory cells. In a preferred embodiment, the refresh pulse generating circuit 90 is implemented with an oscillator.

A power-up signal (PVCCH) is input to the gate of the NMOS transistor 40 through the inverter 20. The drain and source of the NMOS transistor 40 are connected to the input terminal of the inverter 50 and to a ground voltage (VSS), respectively. In response to the power-up signal (PVCCH), the NMOS transistor 40 pulls down the input terminal of the inverter 50 toward the ground voltage level (VSS).

A read command master pulse (RATD) or a write command master pulse (WATD) is input to the gate of the PMOS transistor 30 through the inverter 10. The source and drain of the PMOS transistor 30 are connected to a power voltage (VDD) and the input terminal of the inverter 50, respectively. In response to the read or write command master pulse (RATD or WATD), the PMOS transistor 30 pulls up the input terminal of the inverter 50 toward the power voltage level (VDD).

The read command master pulse (RATD) detects a transition of a read address signal in response to a read command (RD), and the write command master pulse detects a transition of a write address signal in response to a write command (WR).

The inverters 50, 70 and 80 are serially connected. The output terminal of the inverter 50 is connected to the input terminal of the inverter 60. The inverters 50 and 60 latch the signal of the input terminal of the inverter 50. The inverter 80 outputs a Refresh Oscillator Control Signal (ROCS) for controlling the refresh pulse generating circuit 90.

The refresh pulse generating circuit 90 is activated to generate a refresh pulse (REF_WL) for sequentially activating the word lines of the DRAM memory cells, in response to the control signal (ROCS) having a first state (for example, a logic "low" level), and is deactivated in response to the control signal (ROCS) having a second state (for example, a logic "high" level). Therefore, the data bits stored in the DRAM memory cells are sequentially refreshed in response to the refresh pulse (REF_WL).

When the power-up signal (PVCCH) is lower than a predetermined triggering voltage (A), the inverter 20 inverts the PVCCH voltage to a logic high level and the transistor 40 is activated. In response to the activation of the transistor 40, the input terminal of the inverter 50 is pulled toward VSS (e.g., a logic low level), and the input terminal of the inverter 50 is latched to the first state (a logic low level) by the inverters 50 and 60. The output of the inverter 80 is an inverse of the input of the inverter 50, having a second state (e.g., a logic "high" level). If the refresh pulse generating circuit 90 is deactivated in response to the control signal (ROCS) having the second state (at a logic high level), the memory device does not operate, and thus does not consume current for the refresh operation.

When the power-up signal (PVCCH) is equal or higher than the predetermined voltage (A), the NMOS transistor 40 is deactivated. However, since the input terminal of the inverter 50 is latched in the first state by the inverters 50 and 60, the control signal (ROCS) remains at the second state. There is still no current flow for the refresh operations.

When the read command master pulse (RATD) or the write command master pulse (WATD) is activated in response to a read command (RD) or a write command (WR) that is firstly provided after the power-up sequence (T10) is completed, the PMOS transistor 30 is turned on. In response to the activation of the PMOS transistor 30, the input terminal of the inverter 50 is pulled up from the first state (a logic "low" level) toward the second state (a logic "high" level), and the inverter 80 outputs the control signal (ROCS) having the first state (at a logic low level). When the PMOS transistor 30 is deactivated, the input terminal of the inverter 50 is latched at the second state by the inverters 50 and 60, and therefore the control signal (ROCS) remains at the first state.

The refresh pulse generating circuit 90 is activated in response to the control signal (ROCS) having the first state (e.g., at a logic low level), and generates a refresh pulse (REF_WL) for sequentially activating the word lines of the DRAM memory cells. Therefore, the data bits stored in the DRAM memory cells of the memory device are sequentially refreshed in response to the refresh pulse (REF_WL).

Figure 3:
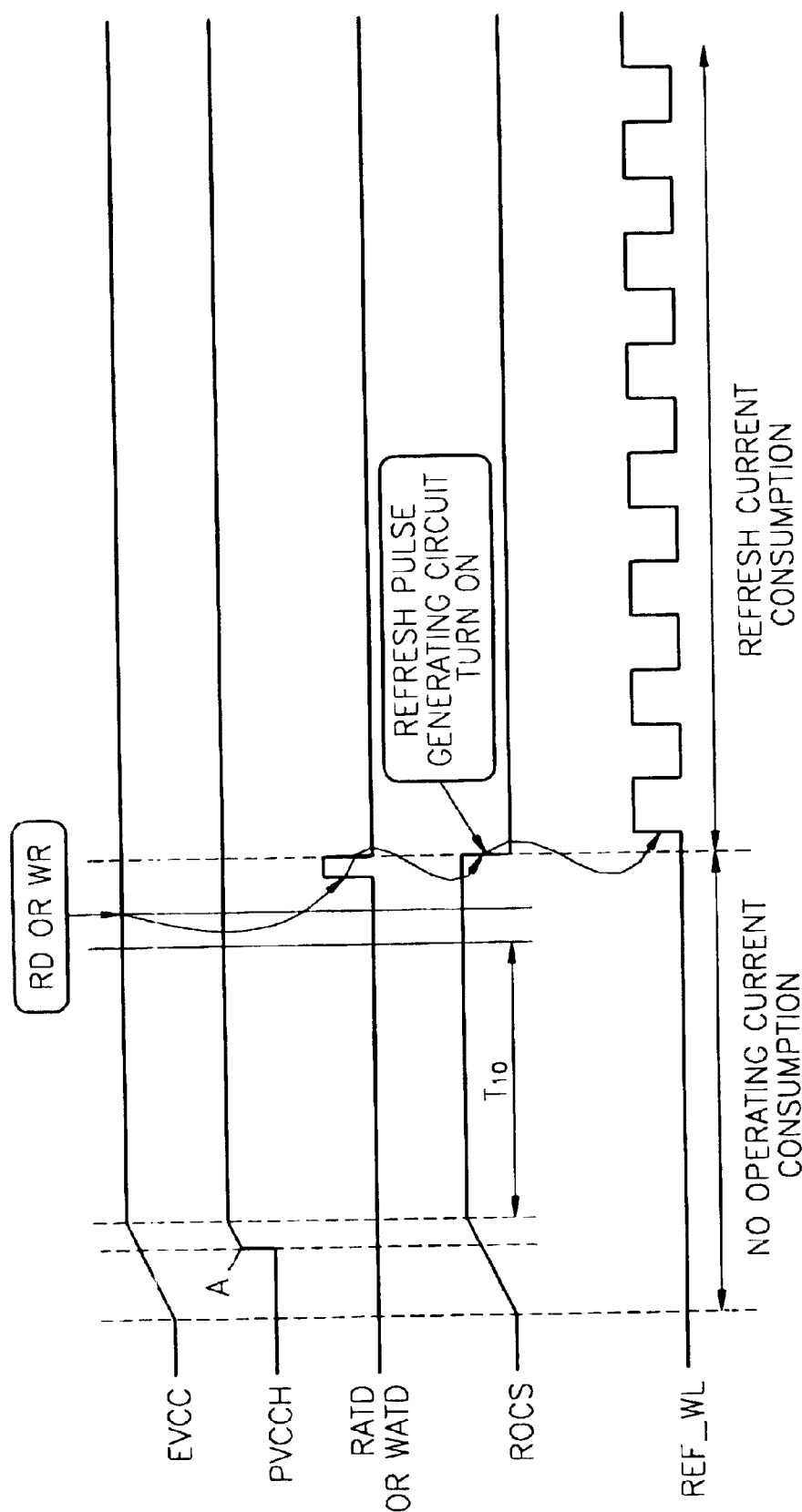
FIG. 3 is a timing diagram of a refresh operation of the apparatus of FIG. 2.

In a preferred embodiment of the present invention, as shown in FIG. 3, during the power-up sequence interval (T10), the control signal (ROCS) is held at the second state (a logic high level), disabling refresh operations. Thus, the memory device according to the present invention does not consume current for the refresh operation during a time period from a time when the power-up signal (PVCCH) is provided to a time when a power-up sequence (T10) is completed.

Advantageously, an apparatus and method for controlling a refresh operation of a memory device according to a preferred embodiment of the present invention, performs a refresh operation after a power-up sequence is completed, and thus prevents current for performing the refresh operation from being consumed. Further, the apparatus and method controls the memory device to perform a stable refresh operation regardless of a level of a predetermined voltage (A) at which a power-up signal (PVCCH) is enabled to a logic "high" level.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for controlling a refresh operation of a memory device comprising DRAM memory cells and a SRAM interface, comprising:

a control circuit for outputting a control signal in a second state in response to a power-up signal during a predetermined period, the second state for disabling refresh operations, and for outputting the control signal in a first state in response to a command signal, wherein the command signal is a first active command input signal after the predetermined period; and a refresh pulse generating circuit for outputting a pulse signal for refreshing the DRAM memory cells in response to the control signal in the first state.

2. The apparatus of claim 1, wherein the control circuit comprises:
   a node;
   a first element for pulling down the node to a logic low in response to the power-up signal;
   a second element for pulling up the node to a logic high in response to the command signal; and
   a third element for inverting the logic level at the node to generate the control signal.

3. The apparatus of claim 2, wherein the first element comprises:
   a first inverter for receiving the power-up signal; and
   an NMOS transistor comprising a gate connected to an output terminal of the first inverter, a drain connected to the node, and a source connected to ground.

4. The apparatus of claim 2, wherein the second element comprises:
   a second inverter for receiving the command signal; and
   a PMOS transistor comprising a gate connected to an output terminal of the second inverter, a source connected to power, and a drain connected to the node.

5. The apparatus of claim 2, wherein the control circuit further comprises a latch element for holding the logic level of the node.

6. The apparatus of claim 5, wherein the latch element comprises:
   a third inverter comprising an input terminal connected to the node; and
   a fourth inverter comprising an output terminal connected to the node, and an input terminal connected to an output terminal of the third inverter.

7. The apparatus of claim 1, wherein the command signal comprises one of a read command and a write command.

8. The apparatus of claim 1, wherein the predetermined period is a period from a time when an external power voltage reaches steady state, to a time when a predetermined time elapses.

9. The apparatus of claim 1, wherein the command signal generates a pulse signal, and wherein the control circuit outputs the control signal in the first state in response to the pulse signal.

10. A memory device comprising DRAM cells, comprising:
    a control circuit for generating a control signal in response to a data write/read command, wherein the command is the first input signal after a power-up sequence is completed; and
    a refresh pulse generating circuit for generating a pulse signal for refreshing the DRAM cells in response to the control signal.

11. The device of claim 10, wherein the power-up sequence is a period from a time when an external power voltage reaches steady state, to a time when a predetermined time elapses.

12. The device of claim 10, wherein the command generates a predetermined pulse signal, wherein the control circuit generates the control signal in response to the pulse signal.

13. A method for controlling a refresh operation of a memory device comprising DRAM memory cells and an SRAM interface, comprising:
    outputting a control signal in a second state during a predetermined period in response to a power-up signal;
    outputting the control signal in a first state in response to a command signal, wherein the command signal is a first active command input signal after the predetermined period; and
    outputting a pulse signal for refreshing the DRAM memory cells in response to the control signal in the first state.

14. The method of claim 13, wherein the predetermined period is a period from a time when the power-up signal is reaches a target level, to a time when a predetermined time elapses.

15. The method of claim 13, wherein the outputting the control signal in the second state comprises:
    outputting a voltage having a logic low level, when a voltage level of the power-up signal is lower than a predetermined voltage level; and
    inverting the logic low level of the voltage to a logic high level to generate the control signal in the second state.

16. The method of claim 13, wherein the outputting the control signal in the first state comprises:
    outputting a voltage having a logic high level in response to the command signal; and
    inverting the logic high level of the voltage to a logic low level to generate the control signal in the first state.

17. The method of claim 13, wherein the command signal generates a predetermined pulse, and wherein the control signal is generated in response to the predetermined pulse.

* * * * *